(12) United States Patent
Crane

(10) Patent No.: US 6,621,428 B1
(45) Date of Patent: Sep. 16, 2003

(54) ENTROPY CODEC FOR FAST DATA COMPRESSION AND DECOMPRESSION

(75) Inventor: Randy T Crane, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/565,015

(22) Filed: May 4, 2000

(51) Int. Cl.[7] .............................................. H03M 7/00
(52) U.S. Cl. ......................................... 341/60; 341/67
(58) Field of Search ............................. 341/67, 56, 65, 341/87, 95, 60

(56) References Cited

U.S. PATENT DOCUMENTS

| | | | |
|---|---|---|---|
| 4,360,840 A | 11/1982 | Wolfrum et al. ............ 358/261 |
| 4,376,933 A | 3/1983 | Saran et al. ................. 340/347 |
| 4,963,867 A | * 10/1990 | Bertrand ...................... 341/60 |
| 5,079,548 A | 1/1992 | Fujiyama et al. ............. 341/67 |
| 5,237,701 A | * 8/1993 | Bertrand ..................... 709/234 |
| 5,499,382 A | 3/1996 | Nusinov et al. ............. 395/800 |
| 5,572,334 A | * 11/1996 | Tanaka ........................ 382/246 |

* cited by examiner

*Primary Examiner*—Peguy JeanPierre

(57) ABSTRACT

An encoder-decoder for processing entropy encoded data. The encoder-decoder provides a bitstream buffer for receiving variable length code words that are extracted from fixed length data words received and stored in a register. Variable length words are loaded into the bitstream buffer until all bits are loaded with data, at which time data is read out of the bitstream register and it is cleared and ready for new data. During decoding, the bitstream buffer receives a fixed length data word that is made up of multiple variable length code words. These code words are individually read out and read into a fixed length register. The contents of the fixed length register are then read out for further processing by a connected system. A controller is provided for coordinating and controlling encoding and decoding operation.

17 Claims, 7 Drawing Sheets

| BIT 6 | BIT 5 | BIT 4 | BIT 3 | BIT 2 | BIT 1 | BIT 0 |
|---|---|---|---|---|---|---|
| IE | EN/DEC | | | FIFO Interrupt Level | | |

FIG. 3

ENTROPY CODEC FOR FAST DATA COMPRESSION AND DECOMPRESSION

TECHNICAL FIELD

The present invention is generally related to an entropy encoder-decoder for fast data compression and decompression. More particularly, the present invention relates to an entropy encoder-decoder which can be used with any compression scheme that incorporates an entropy coding step.

BACKGROUND OF THE INVENTION

In data transmission and processing applications it is common for data to be compressed in accordance with various compression algorithms prior to or during processing or transmission of data. Additionally, it is common for compressed (encoded) data to be decoded during or after processing or transmission to convert the encoded data back into its original form.

Some common compression schemes (or algorithms) incorporate what is known as an entropy coding step. Examples of these common algorithms which incorporate an entropy coding step include LZW, lossless JPEG, G3, G4, etc. Compression schemes which include an entropy encoding step typically generate an output-bitstream which is of variable length. Because of the variable length nature of the encoded output, processing of this data requires a great deal of computational effort on the part of the processing hardware and central processor or controller.

Typical compression hardware is generally dedicated to processing/encoding in accordance with only one pre-defined compression algorithm. Because of this limitation, if data encoded using various compression algorithms is to be processed or transmitted, it is necessary for multiple hardware implementations to be provided to accommodate each of the available compression algorithms/formats. This increases cost associated with processing or transmitting data encoded in accordance with multiple compression algorithms.

The present invention provides for encoder-decoder which can be used with any compression scheme that incorporates an entropy coding step.

SUMMARY OF THE INVENTION

The present invention provides a system and method for encoding and decoding information.

Briefly described, in architecture, the system can be implemented as follows. There is provided an encoder for encoding data comprising a data register for receiving and storing a variable length code word, bitstream register for receiving data, a multiplexor for loading valid bits from the control register into the most significant bits available in the bitstream register, a first-in-first out (FIFO) register for receiving the contents of the bitstream register when all available bits of the bitstream register are loaded with valid bits of data, and an interrupt controller for generating an interrupt signal to initiate a read out of data from the FIFO register.

In a further embodiment of the present invention there is provided a decoder for decoding data. This decoder includes a first register for receiving fixed length encoded data word data, a bitstream register for receiving the fixed length encoded data word, a multiplexor for loading variable length code word data from the bitstream buffer into a data register, and an interrupt controller for generating an interrupt signal to initiate writing of fixed length encoded data into the first register.

The present invention can also be viewed as providing a method of encoding. In this regard, the method can be broadly summarized by the following steps: receiving variable length code word data, determining the number of valid bits of the code word data, loading the code word data into a bitstream buffer if all valid bits will fit. If all valid bits will not fit into the bitstream buffer, loading a first segment of the valid bits into the bitstream buffer and then loading the contents of the bitstream register into a FIFO register, loading a second segment of the partial valid bits into the bitstream buffer.

A further method of decoding data is provided which can be broadly summarized by the following steps: receiving a data word, loading the data word into a buffer, reading out variable length code word from the data word; and loading the variable length code word into a fixed length register.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 3 is a diagram illustrating a control register;

DETAILED DESCRIPTION OF THE PREFERRED EMBODIMENT

The present invention is directed to an encoder and decoder (CODEC) which can be used with substantially any compression scheme incorporating an entropy encoding step. Further, the present invention provides for data FIFO and barrel-shifters that can be used to process data during either encoding or decoding operations.

Figure 1:
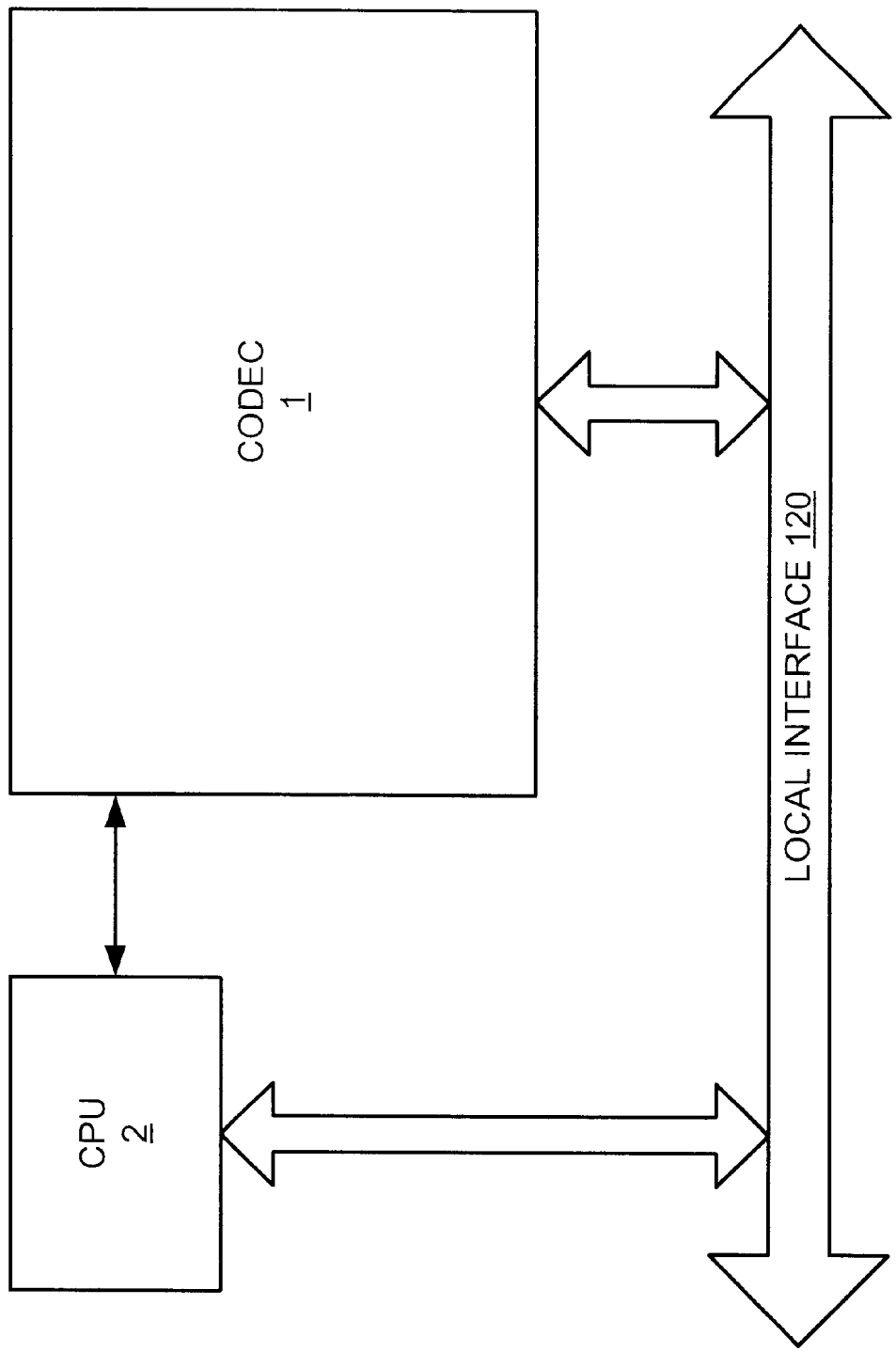
FIG. 1 is a diagram illustrating a system incorporating the CODEC of the present invention.

FIG. 1 illustrates a system incorporating the entropy CODEC of the present invention. There is provided a central processing unit (CPU) 10 that interfaces with CODEC 1 via a local interface 102.

Figure 2:
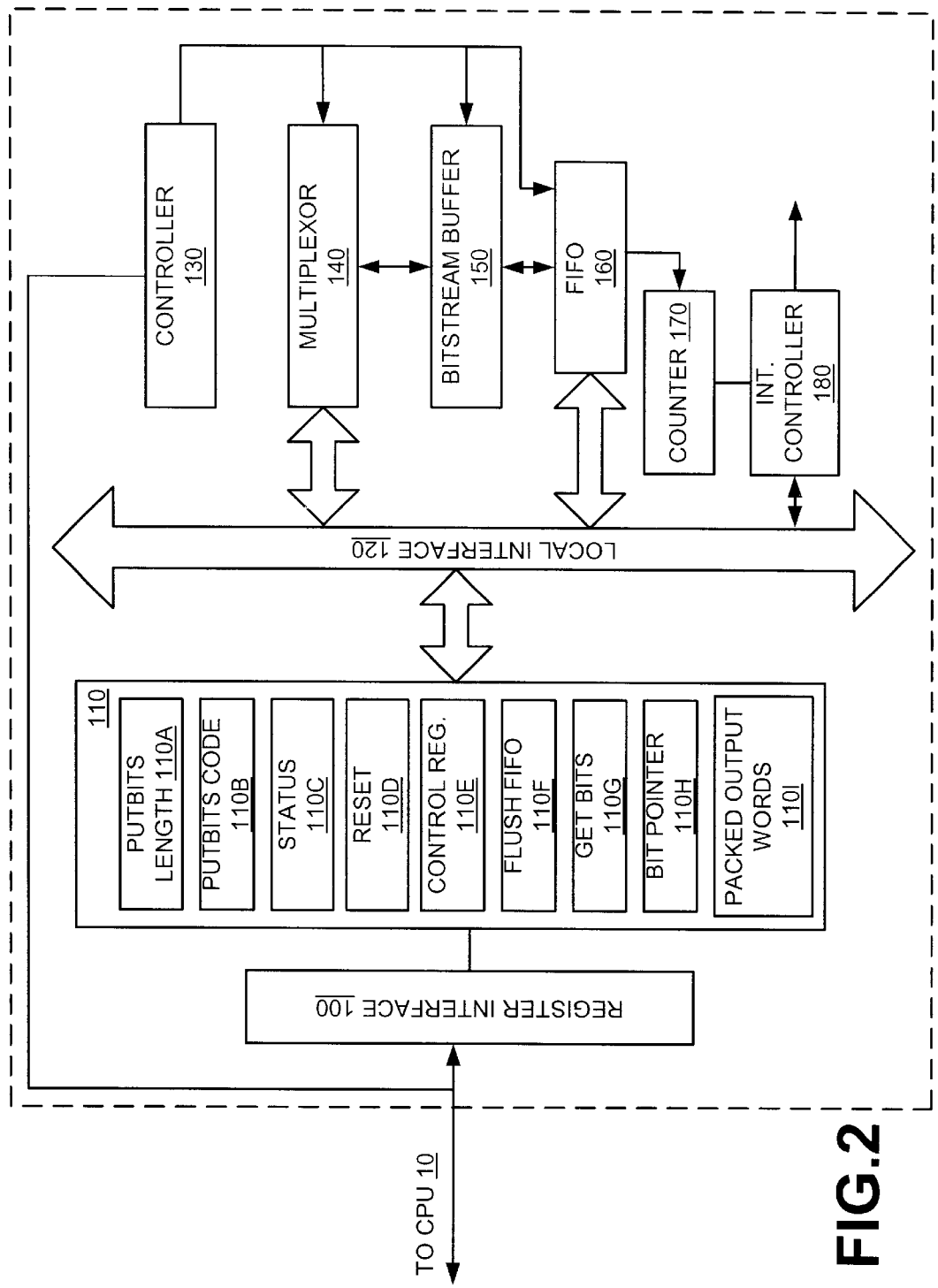
FIG. 2 is a block diagram detailing the CODEC of the present invention.

With reference to FIG. 2 an embodiment of the entropy CODEC 1 of the present invention is illustrated. The CODEC 1 operates in two modes: encode mode and decode mode. FIG. 2 there is shown a register interface 100, a register block 110 and a local interface 120. Register interface 100 interfaces with CPU 10 to control the input and reading of data to/from the registers of register block 110. A counter 170 is provided for counting the level/number of data words stored in FIFO 160 at a given time. Counter 170 provides input to interrupt controller 180 when the level/number of data words stored in FIFO 160 reaches a value corresponding to counter 17.

Register block 110 includes a put-bits length register 110A, a put-bits code register 110B, a FIFO level register 110C, a reset register 110D, a control register 110E, a flush first-in first-out (FLUSH FIFO) register 110F, a get bits register 110G, a bit pointer register 110H and a packed output words register 110I. There is also shown a controller 130 which controls operation of a multiplexor 140, a bit-stream buffer 150, and a first-in-first-out register block (FIFO) 160. Controller 130 operates in accordance with instructions from CPU 10. FIFO 160 is, for example, a 32 bit×16 word FIFO register block. Multiplexor 140 is connected to local interface 120 via which data is transfer to and from the register block 110.

Reset register 110D is a write only register used to reset the hardware, including all pointers and FIFO 160, of the present invention 1. Control register 110E stores data representing the control bits as illustrated in FIG. 3. With reference to FIG. 3, it can be seen that control register 110E can be configured so that, for example, bits 0–4 represent a pre-defined value, or FIFO interrupt level, which represents a maximum or minimum level/number of data words allowed to be stored in FIFO 160, depending upon the mode of operation. Bit 5 of control register 110E is the encode/decode bit (EN/DEC). The value of the EN/DEC bit indicates whether the CODEC 1 is decoding data from the FIFO 160 or encoding data into the FIFO 160. When the EN/DEC bit is, for example 0, the CODEC 1 will encode. This is also referred to as encode mode. When the EN/DEC bit is, for example 1, the CODEC 1, will decode. This is also referred to as the decode mode. Bit 6 of control register 110E represents the interrupt enable bit. The interrupt enable (IE) bit can be, for example, a 1 (HIGH) that enables the CODEC 1 to interrupt the CPU 10. The remaining bits of control register 110E are used to collect variable length code word data. This code word data is subsequently read out from control register 110E and routed to bitstream buffer 150 via multiplexor 140. All bits in the control register 110E will, preferably, default to a 0 upon a reset.

A bit pointer register 110H is provided. The bit pointer register 110H is preferably a read only register which, during encode mode, stores data reflecting a pointer value indicating the next available most significant bit (MSB) in bitstream register 150 that can be loaded with data. Where bitstream buffer 150 is, for example, 32-bits in length, the bitstream pointer register can point to one of 32 bits, bit 0 through bit 31. When the bitstream buffer 150 is full, the bitstream pointer will point to bit 0, which indicates that the bitstream buffer 150 is full. If the bitstream pointer register indicates a value between 1 and 31, then bitstream buffer 150 has bits available to accept data input. For example, if the bit pointer register 110H indicates a value of 28, then it is possible to load additional data into bitstream buffer 150 beginning with the next MSB 29 of bitstream buffer 150. In short, the value in bit pointer 110H specifies the MSB bit in bitstream buffer 150 in which data can be loaded.

Flush FIFO register 110F can be addressed to cause data stored in the bitstream buffer 150 to be written into the FIFO 160. Preferably, the contents of bit pointer register 110H should be read out before writing to the flush FIFO register 110F.

Figure 4:
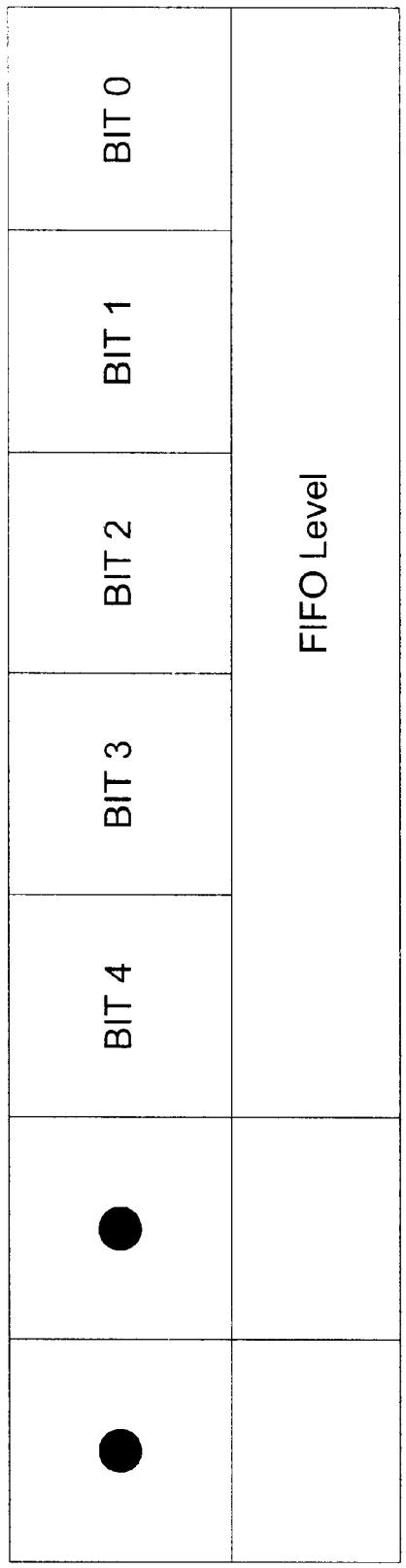
FIG. 4 is a diagram illustrating a FIFO level register.

One example of FIFO level register 110C is illustrated in FIG. 4. Here, it can be seen that bits 0–4 are used to store the FIFO level. The FIFO level is a value representative of the number of data words that can be loaded into FIFO 160 before the contents of FIFO 160 will be read out to make room for additional data words. The FIFO level register 110C can be read from during both encode and decode modes. A put-bits code register 110B is provided for storing data representing the next variable bit-length code word to be output or written to the output data string. Data written to the put-bits code register 110B is preferably right-justified. There is also provided a put-bits length register 110A which stores data indicating the number of bits of the put-bits code register 110B to be written to the output data string. Data written into the put-bits code register 110A causes the CODEC 1 to actually write the code data stored in put-bits code register 110B. In a preferred embodiment, data is first written into the put-bits code register 110B followed by writing data into the put-bits length register 110A.

Get bits register 110G is used during decode mode to extract variable bit-length codes from the input data stream. For example, where it is desired that the next five bits from the data input stream are to be read, a value of 5 will be written into the get bits register 110G. The five lease significant bits of get bits register 110G will then contain the code word.

A packed output word register 110I is provided. Packed output word register 110I can, for example, be accessed/addressed via a controller or central processor (CPU) block read instruction. By reading the data contained in the addressed spaces of packed output word register 110I, the next compressed data word will be output from FIFO 160 to CPU 10.

It will be noted that during encode mode data flow is generally flowing from multiplexor 140 to bitstream buffer 150 to FIFO 160. In decode mode, data flow is generally flowing from FIFO 160 to bitstream buffer 150 to multiplexor 140.

ENCODE MODE

In encode mode, data will be written to control register 110A to set the FIFO interrupt level and the interrupt enable bit. The encode/decode bit will be set to encode. Data to be encoded is loaded into put-bits code register 110B. This data is composed of variable length data words. Controller 130 causes multiplexor 140 to select the valid bits from put-bits code register 110B for reading the valid bits from the fixed length data word into bitstream buffer 150.

Once all bits of bitstream buffer 150 are loaded, the contents thereof are shifted into the first-in/first-out (FIFO) register 160. FIFO register block 160 is associated with a counter 170 which counts the number of 32 bit words contained at any particular time in the FIFO register 160. The count value of counter 170 is stored into FIFO level register 110C as FIFO level data. This data can be used by the CPU 10 to determine whether or not to read or write data into the FIFO 160. For example, the CPU 10 could poll the FIFO level register and when the FIFO level data stored in FIFO level register 160 corresponds to the FIFO interrupt level data stored in control register 110E, depending upon the mode of operation, the CPU could cause data to be read from or written into the FIFO 160. Data can also be read from or written into FIFO 160 where the value of counter 170 corresponds to the contents of the FIFO interrupt level data stored in control register 110E. In this case, the interrupt controller 180 causes an interrupt signal to be directed to CPU 10 to indicate that it is time for the CPU 10 to read (during encode mode) or write (during decode mode) the contents from/to the FIFO register 160.

Figure 5:
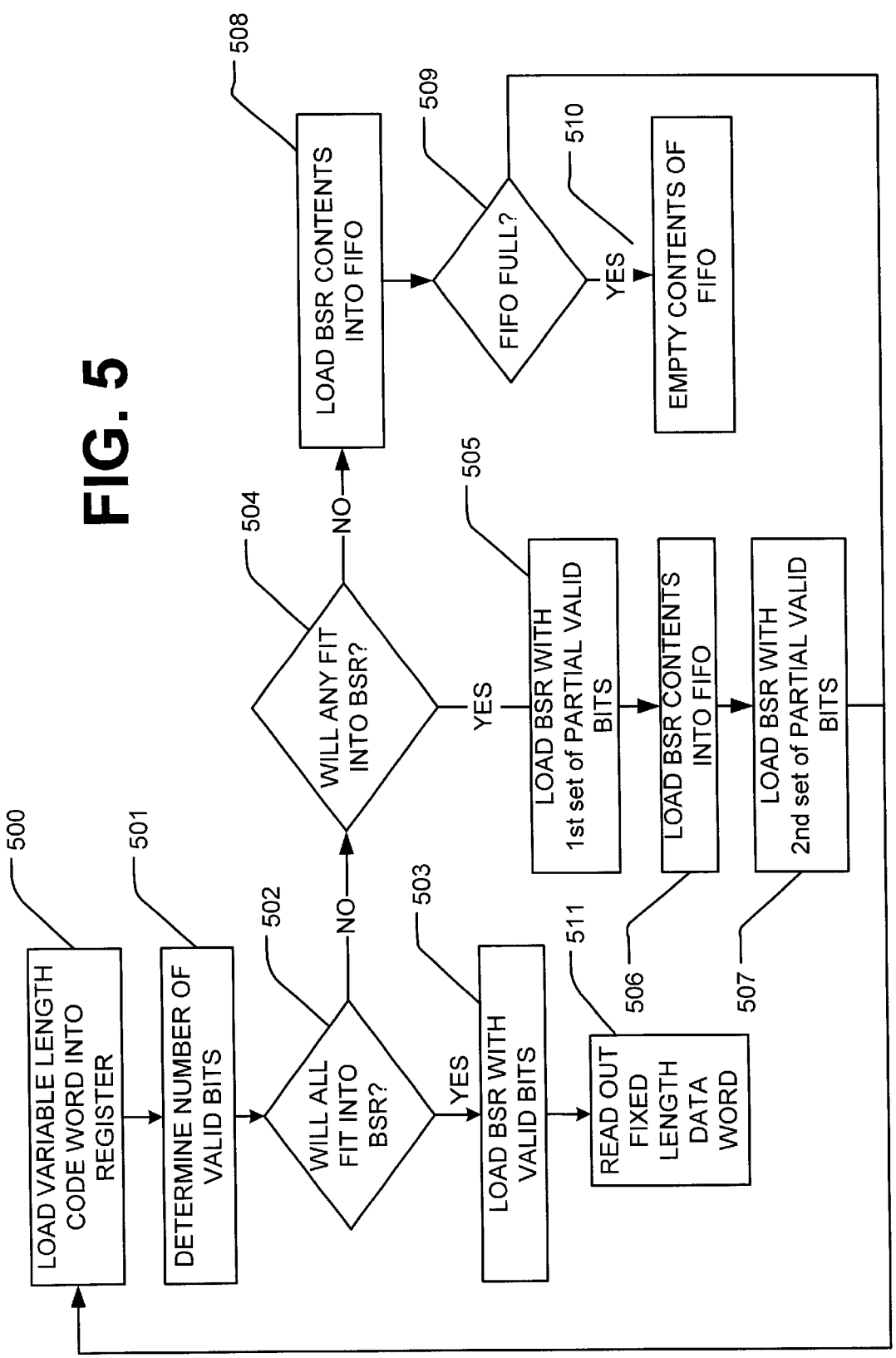
FIG. 5 is a flowchart illustrating the encoding method of the present invention.

FIG. 5 shows a flowchart illustrating the encode method of the present invention. With reference to FIG. 2 and FIG. 5, it will be noted that put-bits length register 110A is addressed to cause a code word to be loaded into, for example, the put-bits code register 110B (500). The code word is of variable length and may be the result of an entropy coding process. Put-bits code register 110A is of a fixed number of bits (length). The length of the variable length code word is stored into put-bits length register 110A. The variable length code word data loaded into put-bits code register 110B may not require all available storage bits of put-bits code register 110B. Once the variable length code word data is loaded into put-bits code register 110B, it may or may not occupy all available bits of the put-bits length register 110B. Where put-bits code register 110A is, for example, 16 bits in length and a variable length code word of 4 bits is loaded into put-bits code register 110B. The 4 bits of put-bits code register 110B that actually store the variable length code word data are said to be valid bits. The number of valid bits of put-bits code register 110B is then determined (501) by referring to the data values previously stored in the get bits register 110G. This determination is made via controller 130. However, it is possible for such determination to be carried out by CPU 10. It is then determined whether all of the valid bits will fit into remaining open bits of bitstream buffer 150 (502). If so, these valid bits are loaded into remaining open bits of bitstream buffer 150 (503) and subsequently read out as fixed length data words (511).

Figure 7:
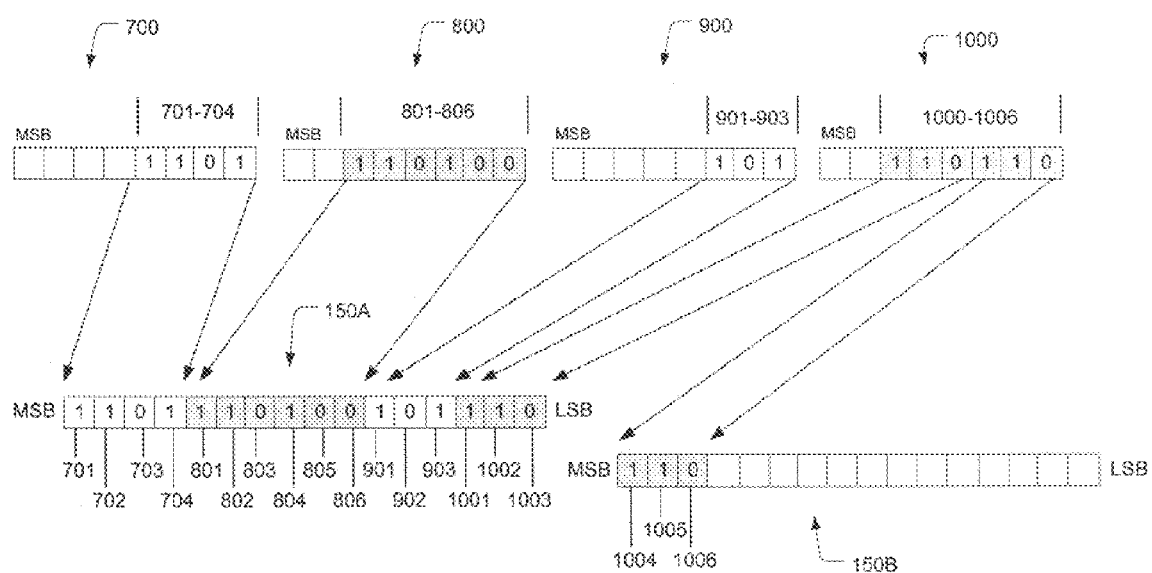
FIG. 7 is a diagram illustrating the process of loading/unloading variable length code words into bitstream buffer 150.

Alternatively, if the valid bits will not fit into bitstream buffer 150, it will be determined if any of the valid bits will fit into the bitstream buffer 150 (504). Where some of the valid bits will fit into bitstream buffer 150, they (first set of partial valid bits) will be loaded into the bitstream buffer 150 (505) to fill all available bits of bitstream buffer 150. The bitstream buffer contents will then be read out to a first-in/first-out (FIFO) register 160 (506). The bitstream buffer 150 is then clear of any data and the second set of partial valid bits is loaded into the bitstream buffer 150 (507). This process is illustrated in FIG. 7, which is further discussed below.

Where none of the valid bits will fit into the bitstream buffer because it is already full of data, the contents of the bitstream buffer 150 will be loaded into FIFO 160 (508). If the FIFO 160 is full (509) the contents thereof will be emptied (510). The FIFO 160 is associated with a counter 170. Counter 170 maintains a count of, for example, the number of 32-bit words actually loaded into the FIFO 160. When the count (value) of counter 170 corresponds to the FIFO interrupt level value stored in control register 110C, interrupt controller 180 will cause an interrupt to be generated and directed to CPU 10. In turn, CPU 10 will read out a predetermined number of words from FIFO 160. This makes room available within FIFO 160 to receive additional code word data from bitstream buffer 150.

DECODE MODE

Figure 6:
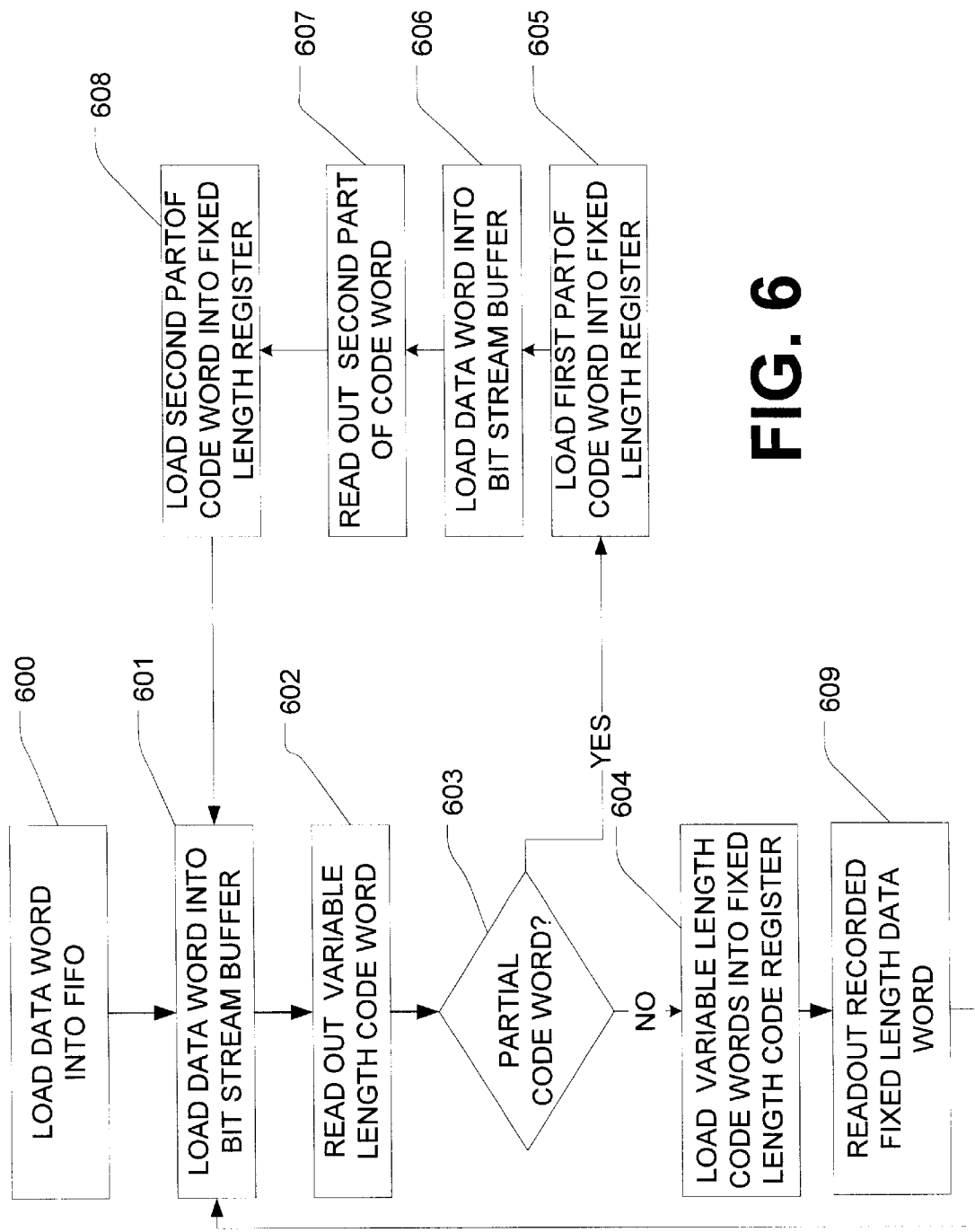
FIG. 6 is a diagram illustrating the decoding method of the present invention.

FIG. 6 shows a flowchart illustrating the decode method of the present invention. In decode mode, data will be written to control register 110A to set the FIFO interrupt level and the interrupt enable bit. The encode/decode bit will be set to decode. Get-bits register 110G is addressed to cause a fixed length data word to be loaded into, for example, FIFO 160. Bitstream buffer 150 receives a fixed length data word from FIFO 160. The fixed length data word is composed of multiple variable length code words. A variable length code word is read out from the bitstream buffer 150 in accordance with data length information stored in get bits register 110G. Multiplexor 140 then routes the variable length code word to get bits register 110G from where it is then read out as a fixed length code word. Operations of multiplexor 140, bitstream buffer 150 and FIFO 160 are controlled by controller 130 in accordance with data stored in register block 110. Once all variable length code words have been read out from the fixed length code word loaded into bitstream buffer 150, another fixed length code word is retrieved from FIFO 160 and loaded into bitstream buffer 150.

FIFO 160 is, for example, a 32 bit by 16-word FIFO register. Counter 170 maintains a count of the number of data words stored in FIFO 160 at a given time and storing this value into FIFO level register 110C. When the value stored in FIFO level register 110C corresponds to a FIFO Interrupt level value stored in control register 110E, interrupt controller 180 generates an interrupt signal. This interrupt signal is directed to the CPU 10, which responds by causing additional fixed length data to be loaded into FIFO 160.

FIG. 7 illustrates how valid bits of variable length code words are read out of put-bits code register 110B and loaded into bitstream buffer 150 during the encode mode operations of the present invention. FIG. 7 also shows how fixed length code words are read out of bitstream buffer 150 and loaded into put-bits code register 110B during the decode mode operations of the present invention. Bitstream buffer 150A depicts the status of bitstream buffer 150 after valid bits of variable length of code words, including a first partial set of data, have completely filled the available bits of bitstream register 150. Bitstream 150B depicts the status of bitstream buffer 150 after a second partial set of variable length code words have been loaded into the bitstream buffer 150.

The initial state of bitstream buffer 150 is clear and all bits are available to receive data. It will be noted that the illustration in FIG. 7 shows bitstream buffer 150 as a 16-bit register. However, in a preferred embodiment, bitstream buffer 150 is 32-bits in length. It will be recognized that bitstream buffer 150 can be any length.

With regard to encode mode operations, it can be seen that the valid bits 701–704 of a first code word 700 are loaded into the most significant four (4) bits of bitstream buffer 150 that are available. Subsequently, the valid bits 801–806 of code word 800 are loaded into the next most significant bits of bitstream buffer 150A that are available. Next the valid bits 901–903 of code word 900 are loaded into the next most significant bits of bitstream buffer 150A which are available. In the case of code word 1000, there are six valid bits of data 1001–1007. However, bitstream buffer 150A only has three (3) available bits remaining for receiving data. In this case, bits 1001–1003 are loaded into the remaining available bits of bitstream buffer 150. Subsequently, the contents of bitstream buffer 150A are read out and stored into FIFO 160. Bitstream buffer 150 is then clear (150B) and open to receive additional data bits. The remaining bits 1004–1006 are then written into the most significant bits of bitstream buffer 150B. This continues until all available bits of bitstream buffer 150 are loaded with valid code word data or, there is no more code word data to be loaded.

In the case of decode operations, variable length code words 701–704 are read out of bitstream buffer 150A and loaded into put-bits code register 110B. Put-bits code register 110B is then read out and cleared. Variable length code words 801–806 are then read out of bitstream buffer 150A and loaded into put-bits code register 110B. This continues until all variable length code words are read out of bitstream buffer 150A. When the variable length code words 1001–1003 are read out and loaded into put-bits code register 110B, it is recognized that these bits are only a partial segment of the full code word. In this case, put-bits code register 110B is not immediately read out and cleared. However another variable length word is written into bitstream buffer 150B. The second segment of the variable length code word, bits 1004–1006 are then read out of bitstream buffer 150B and loaded into put-bits register 110B, which is then read out and cleared of data.

It will be noted that while bitstream register 150 is illustrated herein as a 16-bit register, it can be implemented as any size register as may be suitable for the specific purposes at hand, including but not limited to, for example, an 8-bit register, a 32-bit register or a 64-bit register. Similarly, multiplexor 140 and FIFO 160 can be implemented in whatever bit length desired or determined to be most suitable for the application at hand.

The method of the present invention can be implemented in hardware, software, firmware, or a combination thereof. In the preferred embodiment(s), the method of brokering customer relations is implemented in software or firmware that is stored in a memory and that is executed by a suitable instruction execution system. If implemented in hardware, as in an alternative embodiment, the method of brokering customer relations can implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array (s) (PGA), a field programmable gate array (FPGA), etc.

The flow charts of FIG. 5 and FIG. 6 show the architecture, functionality, and operation of a possible implementation of the encoding and decoding method of the present invention. In this regard, each block represents a module, segment, or portion of code, which comprises one or more executable instructions for implementing the specified logical function(s). It should also be noted that in some alternative implementations, the functions noted in the blocks may occur out of the order noted in FIG. 5 or FIG. 6. For example, two blocks shown in succession in FIG. 5 or FIG. 6 may in fact be executed substantially concurrently or the blocks may sometimes be executed in the reverse order, depending upon the functionality involved, as will be further clarified hereinbelow.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

Therefore, having thus described the invention, at least the following is claimed:

1. An encoder for encoding data comprising:
   a data register comprising a predetermined number of bits, for receiving and storing a variable length code word, said variable length code word comprising valid bits of data to be compressed by an entropy encoding algorithm;
   a bitstream register comprising a predetermined number of bits for receiving data;
   a multiplexor for loading at least a portion of said valid bits into the most significant bits available in said bitstream register;
   a first-in-first out register comprising a plurality of multi-bit registers for receiving the contents of said bitstream register when the predetermined number of bits of the bitstream register are loaded with a portion of said valid bits of data and the remainder of said valid bits of data need to be loaded; and
   an interrupt controller for generating an interrupt signal to initiate a read out of data from said FIFO register.

2. An encoder according to claim 1, wherein said multiplexor comprises a barrel shift register.

3. An encoder according to claim 1, further comprising a counter for counting a number of multi-bit words stored in said FIFO register.

4. An encoder according to claim 3, wherein said interrupt controller generates said interrupt signal when said counter reaches a predetermined interrupt value.

5. An encoder according to claim 1, further comprising a second register for storing data indicating which bits of said bitstream register contain said valid data bits.

6. An encoder according to claim 1, wherein said counter comprises a FIFO level register for storing a value representing a number of multi-bit words stored in said FIFO register at a given time.

7. A decoder for decoding data comprising:
   a first register comprising a plurality of available multi-bit registers for receiving data comprised of a fixed length encoded data word;
   said data word comprises a variable length code word to be decompressed by an entropy decoding algorithm;
   a bitstream register comprising a predetermined number of bits for receiving said fixed length encoded data word;
   a multiplexor for loading said variable length code word from said bitstream register into a data register, said data register comprising a fixed number of bits for receiving and storing said variable length code word; and
   an interrupt controller for generating an interrupt signal to initiate writing of said fixed length encoded data word into said first register.

8. A decoder according to claim 7, wherein said multiplexor comprises a barrel shift register.

9. A decoder according to claim 7, further comprising a counter for counting a number of multi-bit words stored in said FIFO register.

10. A decoder according to claim 9, wherein said interrupt controller generates said interrupt signal when said counter reaches a predetermined interrupt value.

11. A decoder according to claim 7, further comprising a second register for storing data indicating which bits of said bitstream register contain said variable length code word.

12. A decoder according to claim 7, wherein said counter comprises a FIFO level register for storing a value representing a number of multi-bit words stored in said first register at a given time.

13. An encoder for encoding data comprising:
   first data storage means for receiving and storing a variable length code word comprising valid bits of data to be compressed by an entropy encoding algorithm,
   second data storage means comprising a predetermined number of bits, for receiving said variable length code word;

switching means for loading said valid bits from said first data storage means into the most significant bits available in said second data storage means;

third data storage means comprising a plurality of multi-bit registers for receiving the contents of said second data storage means when the predetermined number of bits of the second data storage means are loaded with a portion of said valid bits of data and the remainder of said valid bits of data need to be loaded; and controller means for generating an interrupt signal to initiate a read out of data from said third data storage means.

14. An encoder according to claim 13, wherein said switching means comprises a barrel shift register.

15. An encoder according to claim 13, further comprising means for counting a number of multi-bit words stored in said third data storage means, and wherein said controller means generates an interrupt signal when said means for counting reaches a predetermined interrupt value.

16. A decoder for decoding data comprising:

a first data storage means comprising a plurality of available multi-bit registers for receiving data comprised of a fixed length encoded data word, said data word comprising a variable length code word to be decompressed by an entropy decoding algorithm;

second data storage means comprising a predetermined number of bits for receiving said fixed length encoded data word;

switching means for loading said variable length code word from said second data storage means into a third data storage means, said third data storage means comprising a fixed number of bits for receiving and storing said variable length code word; and means for generating an interrupt signal to initiate writing of said fixed length encoded data word into said first register.

17. A decoder according to claim 16, further comprising counting means for counting a number of multi-bit words stored in said first data storage means, and wherein said interrupt signal is generated when said counting means reaches a predetermined interrupt value.

* * * * *